(12) United States Patent
Burbridge et al.

(10) Patent No.: US 8,316,289 B2
(45) Date of Patent: Nov. 20, 2012

(54) UPDATING SEQUENTIAL DATA

(75) Inventors: Matthew Jack Burbridge, Bristol (GB); Simon Pelly, Bristol (GB); Russell Ian Monk, Caldicot (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 832 days.

(21) Appl. No.: 12/361,669

(22) Filed: Jan. 29, 2009

(65) Prior Publication Data

US 2010/0192050 A1  Jul. 29, 2010

(51) Int. Cl.
*G06F 11/00* (2006.01)
(52) U.S. Cl. .................................................. 714/807
(58) Field of Classification Search .............. 714/758, 714/807
See application file for complete search history.

(56) References Cited

U.S. PATENT DOCUMENTS

| | | | |
|---|---|---|---|
| 6,446,238 B1 * | 9/2002 | Canestaro et al. ............ | 714/807 |
| 6,510,532 B1 | 1/2003 | Pelly | |
| 6,636,992 B1 * | 10/2003 | Yuan et al. .................... | 714/52 |
| 7,100,102 B2 * | 8/2006 | Hooper et al. ................ | 714/758 |
| 7,111,228 B1 * | 9/2006 | Ricci ............................. | 714/805 |
| 7,274,526 B2 | 9/2007 | Morling | |
| 7,349,176 B2 | 3/2008 | Monk | |
| 7,372,661 B2 | 5/2008 | Monk | |
| 7,752,489 B2 * | 7/2010 | Deenadhayalan et al. ... | 714/6.12 |
| 2003/0145131 A1 | 7/2003 | Pelly | |
| 2003/0145133 A1 | 7/2003 | Pelly | |
| 2004/0123221 A1 * | 6/2004 | Huffman et al. .............. | 714/776 |
| 2004/0158793 A1 * | 8/2004 | Blightman et al. ........... | 714/758 |
| 2005/0172205 A1 * | 8/2005 | Lin et al. ....................... | 714/758 |
| 2005/0248870 A1 | 11/2005 | Monk | |
| 2005/0248874 A1 | 11/2005 | Monk | |
| 2005/0248875 A1 | 11/2005 | Monk | |
| 2006/0164748 A1 | 7/2006 | Morling | |
| 2007/0220304 A1 | 9/2007 | Slater | |
| 2008/0183908 A1 | 7/2008 | Slater | |
| 2008/0212224 A1 | 9/2008 | Evans | |
| 2008/0270106 A1 | 10/2008 | Slater | |
| 2009/0077309 A1 | 3/2009 | Slater | |
| 2009/0113145 A1 | 4/2009 | Slater | |

* cited by examiner

*Primary Examiner* — Scott Baderman
*Assistant Examiner* — Elmira Mehrmanesh (57) ABSTRACT

Disclosed is a storage apparatus comprising a data store; a data input; and a data processor arranged to: receive from the data input a block of data to be stored at an append point after sequential data comprising one or more stored blocks of data; retrieve an integrity measure, of one or more stored integrity measures that are associated with one or more respective points in the sequential data, said retrieved integrity measure being associated with a point at or preceding the append point; calculate a new integrity measure using the received block of data and the retrieved integrity measure; and store the received block of data and the new integrity measure in the data store, in addition to at least one stored integrity measure that is associated with a point in the data at or preceding the append point.

20 Claims, 8 Drawing Sheets

UPDATING SEQUENTIAL DATA

BACKGROUND

Transfer, storage or retrieval of data can introduce accidental errors, and it is therefore important to develop methods for detection of such errors. For this purpose, various error detecting functions have been developed (for example checksums, cyclic redundancy checks (CRC) and hash functions) and are widely employed for validating and maintaining data integrity. Such functions typically take a block of data of arbitrary length and produce an integrity measure of particular data type and length (for example a 32-bit integer). The integrity of the data can be checked at any later time by re-computing the integrity measure and comparing with the previously calculated integrity measure. If the integrity measures do not match the data has been altered.

When data is purposely modified by truncation, the corresponding integrity measure is no longer valid. It is therefore necessary to recalculate the integrity measure for the truncated data, which requires re-reading of all data up to the point of truncation. In the case of large data files, this can be a costly and time consuming operation.

The problems associated with recalculating the integrity measure of data following truncation are particularly relevant to applications where data is stored in large sequential files (for example on tape media in a tape library or in a virtual tape library) containing typically several megabytes, gigabytes or even terabytes of data.

Features and advantages of embodiments of the invention will become apparent from the following description of preferred embodiments of the invention, given by way of example only, which is made with reference to the accompanying drawings.

DETAILED DESCRIPTION

Various embodiments of the present invention will now be described in more detail with reference to the accompanying figures. It will be appreciated that the invention is not limited in its application to the details of method and the arrangement of components as set forth in the following description or illustrated in the drawings. It will be apparent to a person skilled in the art that additional embodiments of the present invention not detailed in the description are possible without departing from the scope or intention of the present invention. Accordingly, the following description should not be interpreted as limiting in any way, and all such embodiments are intended to fall within the scope of the claims of the present invention.

Calculating an integrity measure of a block of data is generally performed using known methods such as a CRC, checksum, hash function or other known method. Functions of this type take as input a data block B of arbitrary length, and produce as output a value C of particular type and length (for example a 32-bit integer) which provides an integrity measure for the input data. In addition, checksum, CRC and hash functions can be seeded by a seed value S such that $C=F(B,S)$. In practice, calculation of an n-bit CRC (for example the commonly used 32-bit CRC-32 function) is typically implemented using an n-bit shift register which is preset (seeded) to all ones (−1 in twos complement binary).

By way of example only embodiments of the invention will be explained in terms of CRC functions. However, a person skilled in the art will understand that references to the term CRC, as used in the following description, can apply equally to any integrity measure including but not limited to CRC, checksum and hash functions. Moreover, depending on the context, the term CRC can denote either the function used to calculate the integrity measure, or the value of the integrity measure itself.

The term "block" as used herein refers to a plurality of data elements stored, recorded, processed, or transmitted as a unit. The elements can be single bits or groups of bits representing (without limitation) digits, characters, words, or physical records. A block may be stored on any media suitable for storage of digital data, including but not limited to random access memory (RAM), magnetic disk, optical disk, magnetic tape and semiconductor based storage. Moreover, in the present context, a block of data may itself comprise an implicit data structure such as a database record, backup session, video frame or log entry. Therefore, a person skilled in the art will understand that the term "block" in intended generically and should be interpreted as such.

Figure 1A:
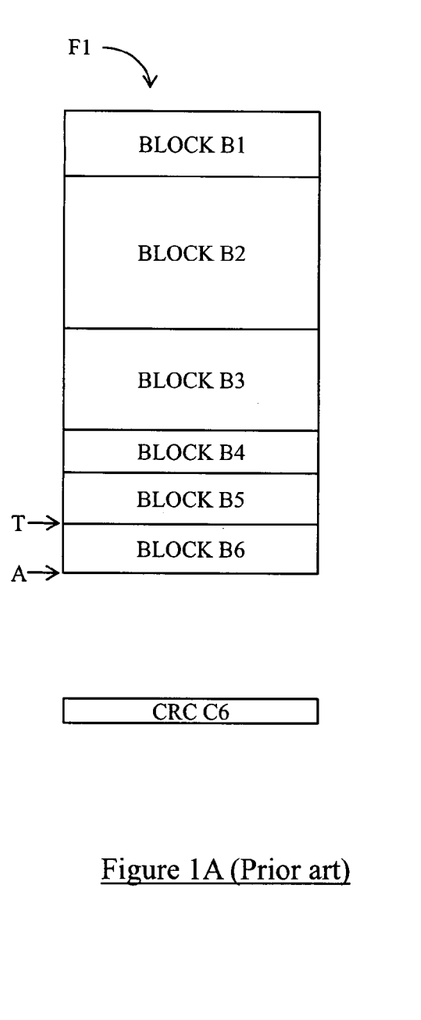
FIG. 1 is a block diagram showing a prior art method of storing sequential data.

FIG. 1A illustrates a file F1 comprising plurality of blocks B1-B6 stored according a prior art method for sequentially storing data. Blocks of data B1-B6 are stored sequentially such that a block Bx is stored at the boundary of the preceding block Bx−1. Thus, when a new block of data is appended to the file, it is stored at the boundary of the last block of data contained in the file. In order to maintain an integrity check of file F1, a CRC C6 is calculated and stored. The CRC C6 may be stored separately from the file F1 (for example in a log file) or alternatively may be appended to the file F1 in a known way.

Figure 1B:
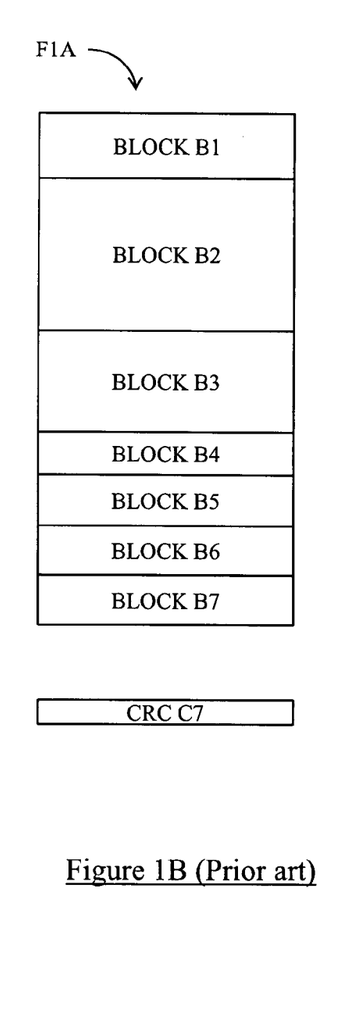

FIG. 1B illustrates appending a new block of data B7 to an append point A of file F1 to produce an appended file F1A according to the prior art method. A new CRC C7 for the appended file F1A as a whole is calculated using the existing CRC C6 and the data contained in the new block B7. In effect, the new CRC C7 is calculated over the data of block B7 and by seeding the CRC function with CRC C6. The new CRC is stored separately to the file F1A, or alternatively may be appended to file F1A in a known way.

Figure 1C:
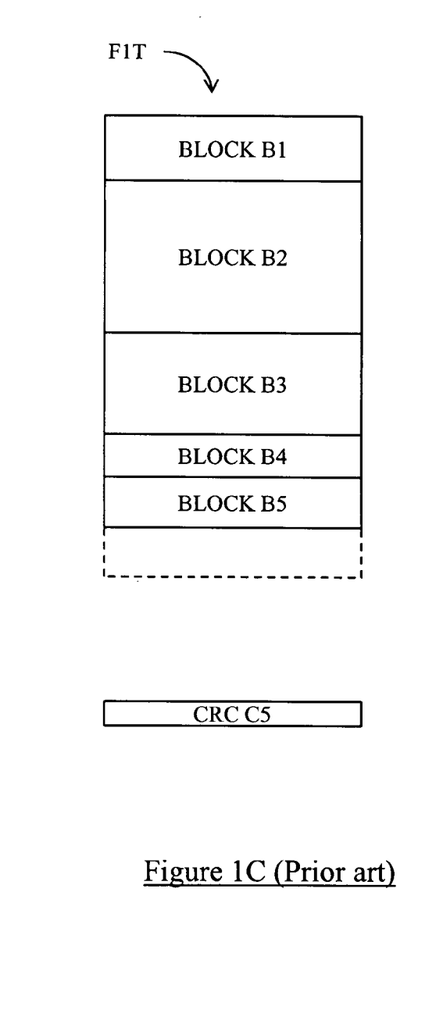

Truncation of file F1 is illustrated in FIG. 1C. The truncated file F1T has been truncated by deletion of block B6 (or in any other way rendering the block unreadable) and as a result the overall CRC C6 has been rendered invalid as an integrity measure of the truncated file F1T. Consequently, it is necessary to calculate a new CRC for the truncated file F1T which, according to prior art methods, requires re-reading of the truncated file F1T in its entirety to the point of truncation T. In the example shown in FIG. 1C, calculation of CRC C5 requires re-reading of blocks B1-B5. While this may otherwise appear trivial, in back-up storage systems (including but not limited to tape libraries, virtual tape libraries etc.), typically, a file may contain several million blocks of data, and the resultant CRC calculation following truncation can be costly and time consuming. To illustrate this, consider a situation where a file comprising 1 million blocks is truncated by one record thereby having to recalculate the overall CRC for the remaining 999,999 blocks.

Embodiments of the present invention provide a method and apparatus for storing sequential data such that an integrity measure of the file as a whole can be efficiently calculated following alteration of the file by truncation or appending. More specifically, an integrity measure for the file as a whole following truncation can be calculated without recalculating the integrity measure for the whole file.

Figure 2A:
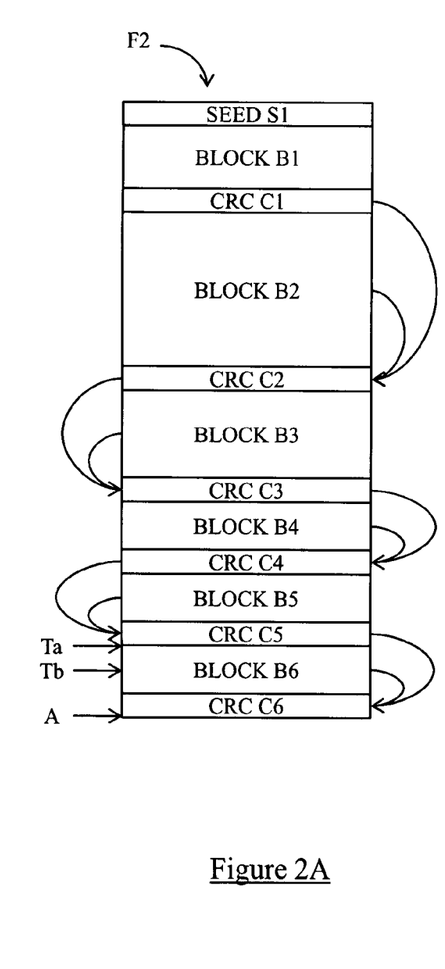
FIG. 2 is a block diagram showing a method of storing sequential data according to an embodiment of the present invention.

FIG. 2 shows a data structure which illustrates an embodiment of the present invention. File F2 shown in FIG. 2A comprises blocks of data B1-B6 and corresponding CRC values C1-C6. The CRC values C1-C6 are stored between blocks such that each block of data is followed by the corresponding CRC value. Each CRC value is an integrity measure of the sequential file up to that point in the file where the CRC is stored. For example, CRC C2 provides an integrity measure for blocks B1-B2, CRC C3 provides an integrity measure for blocks B1-B4 and so forth. CRC C6 provides an integrity measure for the file as a whole. Also stored at the beginning of file F2 is a seed value S1 used for calculation of CRC C1. Seed S1 can be an arbitrary value in a data format compatible with the chosen CRC function (for example 32-bit integer represented in binary from). Typically seed S1 will be set to −1 as described above, but may alternatively be set according to any predetermined criteria.

Figure 2B:
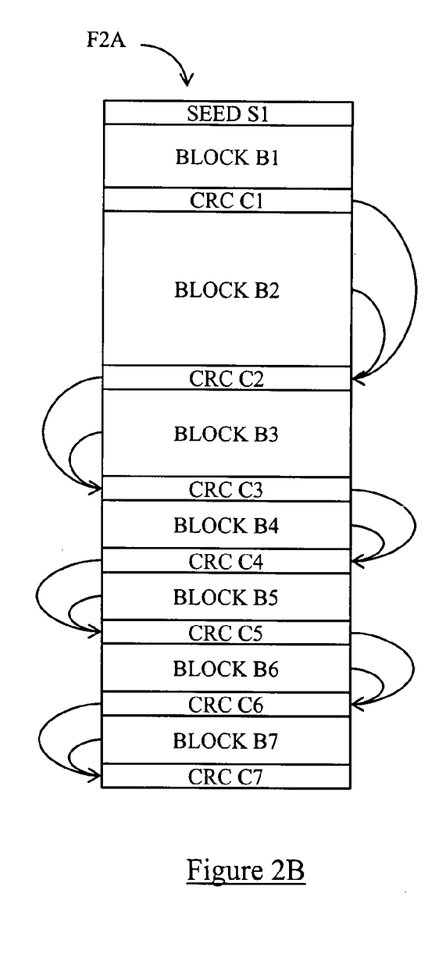

When a new block is appended to file F2 at an append point A, a new CRC value is calculated using the CRC for the preceding block and the data contained in the new block. FIG. 2B illustrates storing a new block of data B7 to produce appended file F2A in accordance with the present embodiment. The new block of data B7 and the new overall CRC C7 are stored at the end of file in a known way to produce appended file F2A. The new CRC C7 provides an integrity measure of the file as a whole, and is calculated using the CRC C6 of the preceding block B6 and new block B7.

Figure 2C:
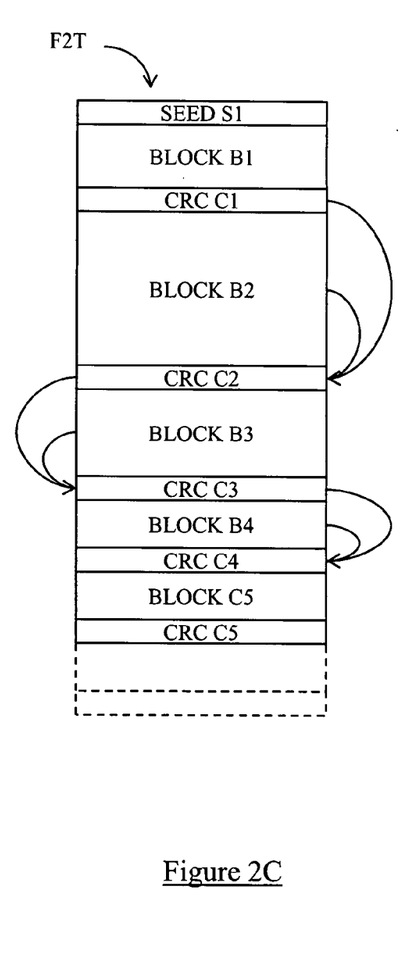

FIG. 2C shows truncation of file F2 at truncation point Ta to produce a truncated file F2T. CRC C6 and block B6 are deleted in a known way so that the truncated file now contains seed S1, blocks B1 to B5 and CRCs C1 to C5. CRC C5 is now the overall CRC for the truncated file F2T and no further CRC calculation is necessary. Hence the requirement to recalculate the CRC for the truncated file F2T has been obviated. If required, subsequent appending of a new block to the truncated file F2T may be performed as described in the preceding paragraph with reference to FIG. 2B. If the truncation point does not correspond to a stored CRC value the integrity measure can still be efficiently calculated according to the present embodiment. For example, if file F2 of FIG. 2A is truncated to a point Tb within block B6 such that a portion of B6 remains, the overall CRC for the truncated file can be easily calculated using CRC C5 and the remaining portion of block B6. Again, rereading of the whole truncated file has been obviated.

Figure 3A:
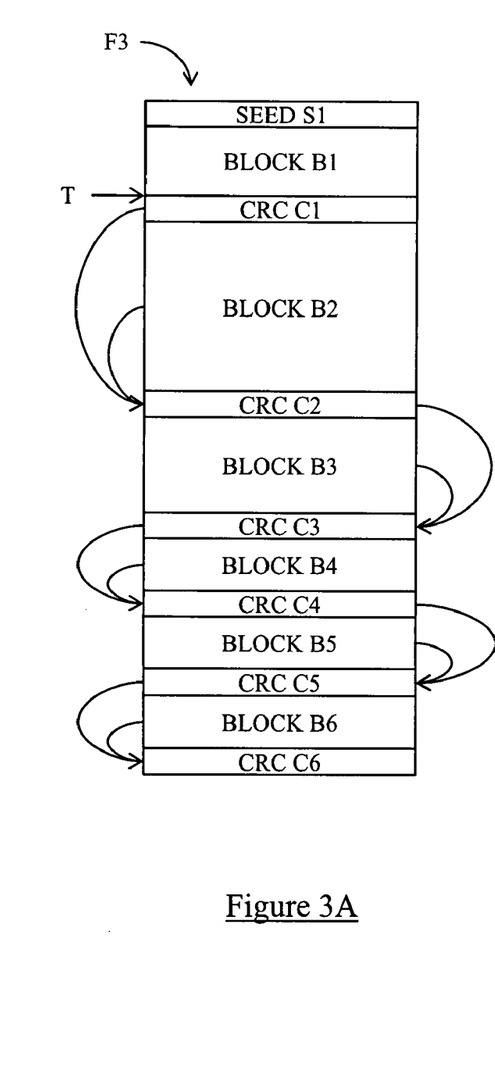
FIG. 3A is a block diagram showing a method of truncating sequential data from the start of a file according to an embodiment of the present invention.
Figure 3B:
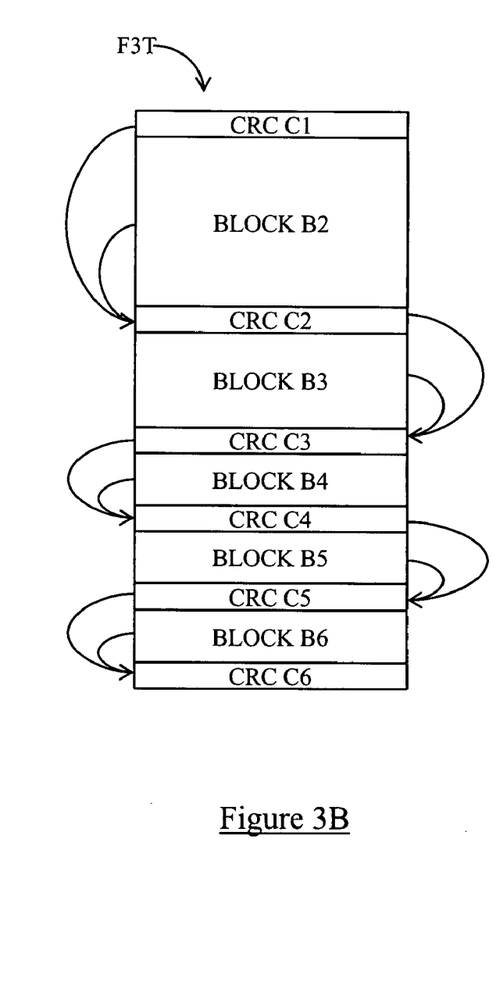
FIG. 3B is a block diagram showing a method of truncating sequential data from the end of a file according to an embodiment of the present invention.

FIGS. 3A and 3B illustrate deletion of a block of data B1 from the beginning of sequential file F3 to truncation point T to produce truncated file F3T, such that the overall integrity check of the resulting truncated file F3T is maintained. Seed S1 and block B1 are deleted but CRC C1 corresponding to deleted block B1 is retained in the truncated file F3T. CRC C1 is now effectively a seed value for all subsequent integrity checks on the truncated file F3T. For example, CRC C2 is equivalent to a CRC calculated on block B2 seeded with CRC C1. Similarly, CRC C6 provides an integrity measure of the truncated file F3T as a whole, and is equivalent to a CRC calculated on blocks B2-B6 seeded with CRC C1. Thus, the CRC values C1-C6 after truncation provide a valid integrity measure of the truncated file F3T, and recalculating the CRC is not required.

Figure 4A:
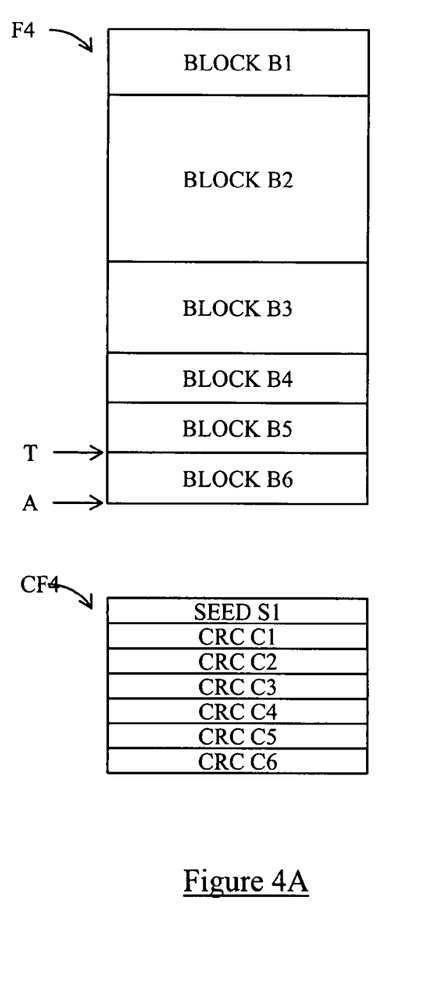
FIG. 4 is a block diagram showing a method of storing sequential data according to an embodiment of the present invention.

FIG. 4A illustrates an alternative way of storing data according to an embodiment of the present invention, whereby the seed S1 and intermediate CRC values C1-C6 are stored in a sequential CRC file CF4 separate from blocks B1-B6 which are stored in file F4. The first CRC value C1 stored in file CF4 corresponds with the first block B1 of file F4, CRC C2 corresponds to block B2 and so forth. When file F4 is appended or truncated according to the previously described examples, the appropriate CRC value (or seed S1) is deleted (in the case of truncation) or added (in the case of appending) as required.

Figure 4B:
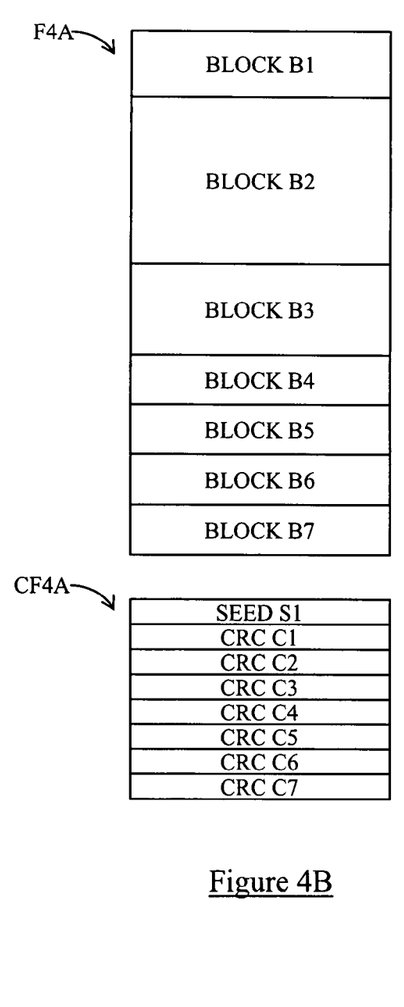

When a new block is appended to file F4 at an append point A, a new CRC value is calculated using the CRC C6 (as the seed) for the data up to and including the preceding block and the data contained in a new block B7. FIG. 4B illustrates storing the new block of data B7 to produce appended file F4A in accordance with the present embodiment. The new block of data B7 is stored at the end of file F4 in a known way to produce appended file F2A. The new overall CRC C7 is stored at the end of file CF4A in a known way. The new CRC C7 provides an integrity measure of file F4A as a whole, and is calculated using the CRC C6 of the preceding block B6 and new block B7.

Figure 4C:
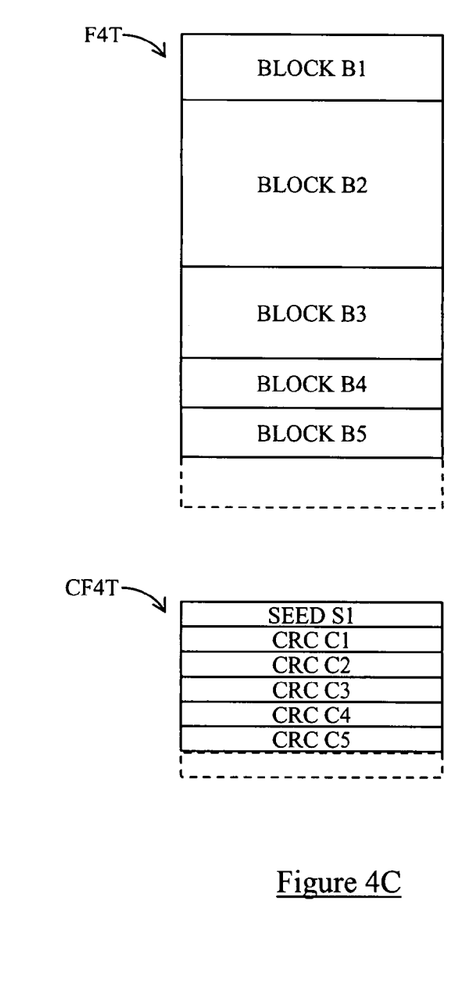

FIG. 4C shows truncation of file F2 at truncation point T to produce a truncated file F4T. CRC C6 and block B6 are deleted (from file CF4 and F4 respectively) in a known way so that the truncated file F4T now contains blocks B1 to B5 and file CF4T contains seed S1 and CRCs C1 to C5. CRC C5 is now the overall CRC for the truncated file F4T and no further CRC calculation is necessary. Hence the requirement to recalculate the CRC for the truncated file F4T has been obviated. If required, subsequent appending of a new block to the truncated file F4T may be performed as described in the preceding paragraph with reference to FIG. 4B.

In the previously described examples the blocks of data B1-B6 are stored sequentially in physical memory. However, in other embodiments data is stored using alternative structures including but not limited to linked lists and binary trees, as will now be discussed.

Figure 5:
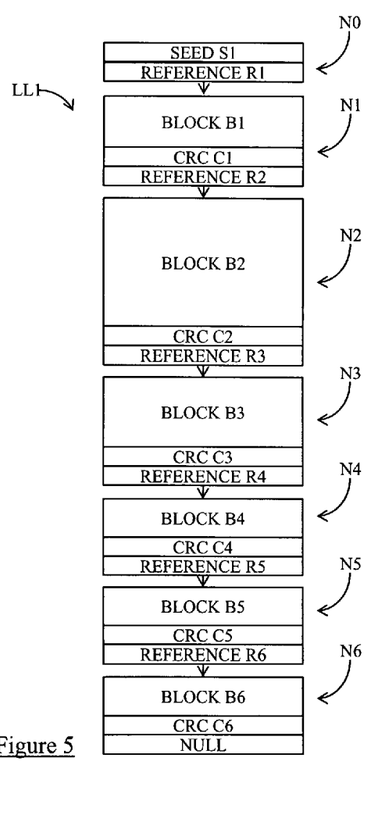
FIG. 5 is a block diagram showing a method of storing data in a linked list according to an embodiment of the present invention.

FIG. 5 shows a singly linked list LL1 according to an embodiment of the invention. The list comprises nodes N1-N6 and each node comprises a block of data B1-B6, a corresponding CRC value C1-C6 and a reference R2-R5 to the next block in the linked list LL1 (node N6 is the last node in the list and contains a NULL reference). Also included in the linked list is a seed node N0 comprising a seed S1 and reference R1 to node N1. Alternatively, each node may include two references such that the list may be doubly linked in a known way. The CRC stored at each node provides an integrity check for all data blocks stored in nodes up to and including the node at which the CRC is stored.

Linked list LL1 of FIG. 5 can be appended and truncated in accordance with embodiments of the present invention as described above. For example, if node N6 is deleted, CRC C5 of node N5 is a valid integrity measure for the linked list LL1 as a whole and reference R6 is set to NULL. If a new node N7 (not shown in FIG. 5) is appended to list LL1 after node N6, reference R6 is updated to refer to the memory address of node N7 and a new CRC C7 is calculated using CRC C6 and the data contained in block B7 of the appended node N7. Furthermore if node N1 is deleted from the front of list LL1, the seed S1 is updated to equal CRC C1 and reference R1 is updated to equal R2. In this way the continuity of the truncated link list LL1 is preserved and the CRCs stored at each node remain valid.

Figure 6:
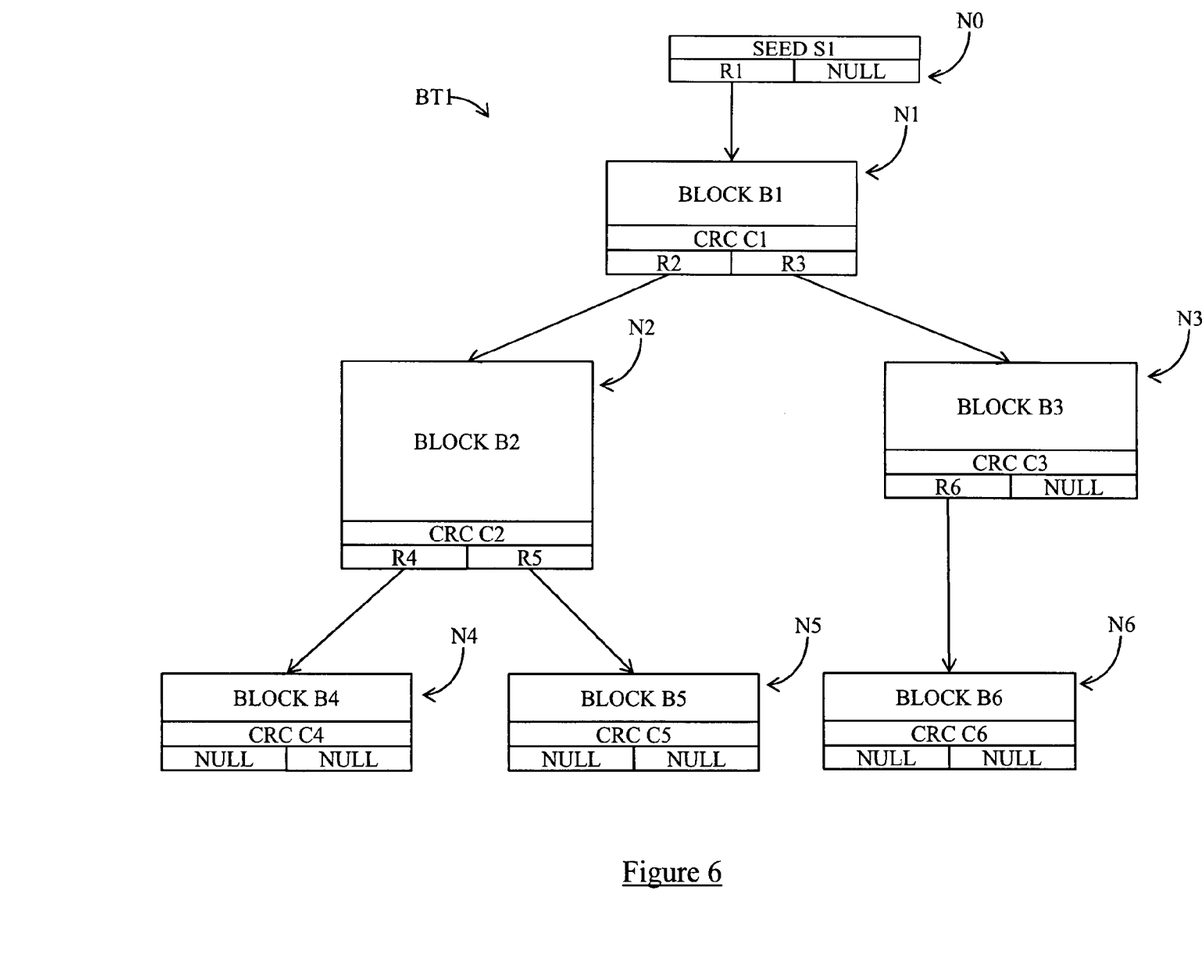
FIG. 6 is a block diagram showing a method of storing data in a binary tree according to an embodiment of the present invention.

FIG. 6 illustrates a further embodiment of the present invention implemented as a binary tree BT1 comprising six nodes N1-N6. Each node includes a block B1-B6, a CRC C1-C6 and references to the left and right child nodes R2-R6. Where a node does not link to a left child node or to a right child node, the appropriate reference is NULL. Also included in the binary tree is a seed node N0 comprising a seed S1 and reference R1 to node N1. In FIG. 6, nodes N2 and N3 are the children of node 1; nodes N4 and N5 are the child nodes of node N2; and, node N6 is the child node of node N3. The CRC values stored at the end of each branch of binary tree BT1 provide an integrity measure of the blocks contained in that branch. For example, CRC C4 is an integrity measure for the branch containing blocks B1, B2 and B4. Binary tree BT1 of FIG. 6 can be appended and truncated in accordance with embodiments of the present invention as described above. For example, if node N6 is deleted, CRC C3 of node N3 is a valid integrity measure for the branch containing block B1 and B3, and reference R6 is set to NULL. If a new node N7 (not shown in FIG. 5) is appended to binary tree BT1 as a left child node of node N6, the appropriate reference of node N6 is updated to refer to the memory address of node N7 and a new CRC C7 is calculated using CRC C6 and the data contained in block B7 of the appended node N7. Truncation of node N1 from the front of binary tree BT1 results in two separate binary trees, the first containing nodes B2, B4 & B5, the second B3 and B6. In this instance, seed S1 is updated to equal CRC C1, reference R1 is updated to equal R2 and the NULL reference is updated to equal R3. Alternatively, a second seed node can be created so that each binary tree has a separate seed node. In both cases, the seed of both seed nodes is set to equal CRC C1 and the integrity of both binary trees is preserved.

Figure 7:
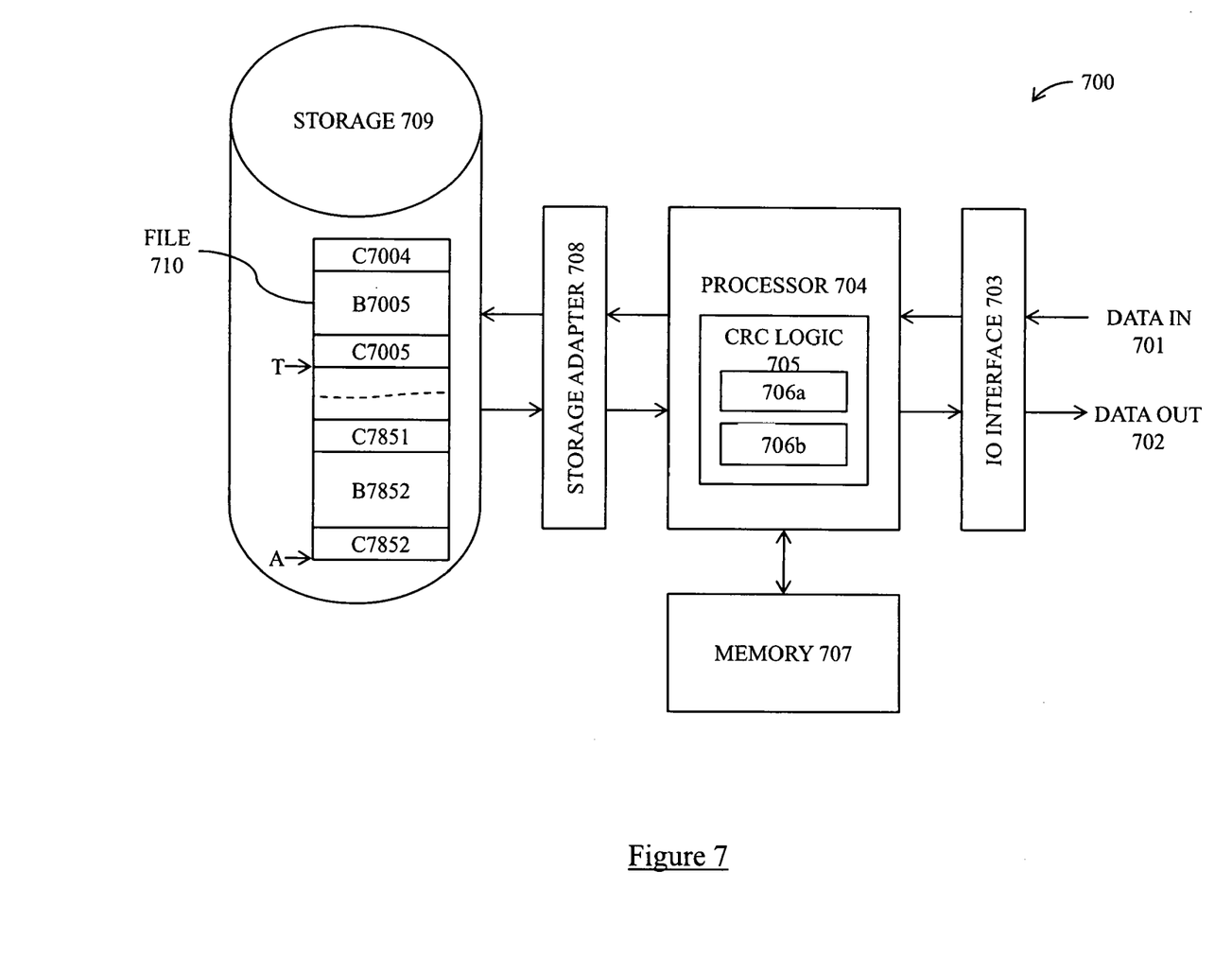
FIG. 7 is a block diagram showing components of a system according to an embodiment of the present invention.

FIG. 7 show an exemplary hardware apparatus 700 for enacting the embodiments previously described. An interface 703 is adapted to receive data 701 and send data 702. The interface 703 is operably connected to a processor 704 which comprises a CRC logic 705 and is in turn operably connected to flash memory 707. CRC may include registers 706a and 706b which are configured to store the first and last CRC values of a file 710 stored in disk storage 709 (CRC C7004 and CRC C7852 respectively). For reasons of clarity, file 710 in FIG. 7 is shown with only two blocks of data (B7005 and B7852), but it will be understood that the file 710 may contain many thousands, millions or billions of blocks. The processor 704 is operably connected to disk storage 709 via storage adapter 708. The storage adapter 708 is typically a dedicated processor, such as an ASIC, which is programmed to handle high speed read and write operations. The processor 704 is a general purpose programmable processor, such as an Intel Pentium™ processor, which controls overall operation of the system 700 according to a control program stored in and loaded from flash memory 707. Alternatively, the flash memory 707 may be replaced by random access memory, and the control program may be stored elsewhere and loaded to the random access memory when the system is initiated (booted). The control program may be written in any suitable programming language including but not limited to Java, C++, C#, or combinations thereof. A person skilled in the art will realise that the present invention is not limited to a particular programming language. Alternatively or additionally, the control program may also be embodied in hardware such as a dedicated ASIC.

The processor 704 is arranged to receive a block of data via the interface 703. Typically the received block will be accompanied by an instruction associated with the way in which the block is to be appended to the file. CRC logic 705 is configured to calculate a new CRC for file 710 using the received block of data and, where necessary, using the first and last CRC values stored in registers 706a and 706b respectively. Where the accompanying instruction comprises truncation of file 710, processor 704 is configured to retrieve the CRC value before the point of the truncation from disk storage 709 via controller 708. When calculation of the updated CRC is completed by processor 704 and CRC logic 706, the block of data and updated CRC are sent to storage adapter 708 and stored at the appropriate logical location in disk storage 709.

Figure 8:
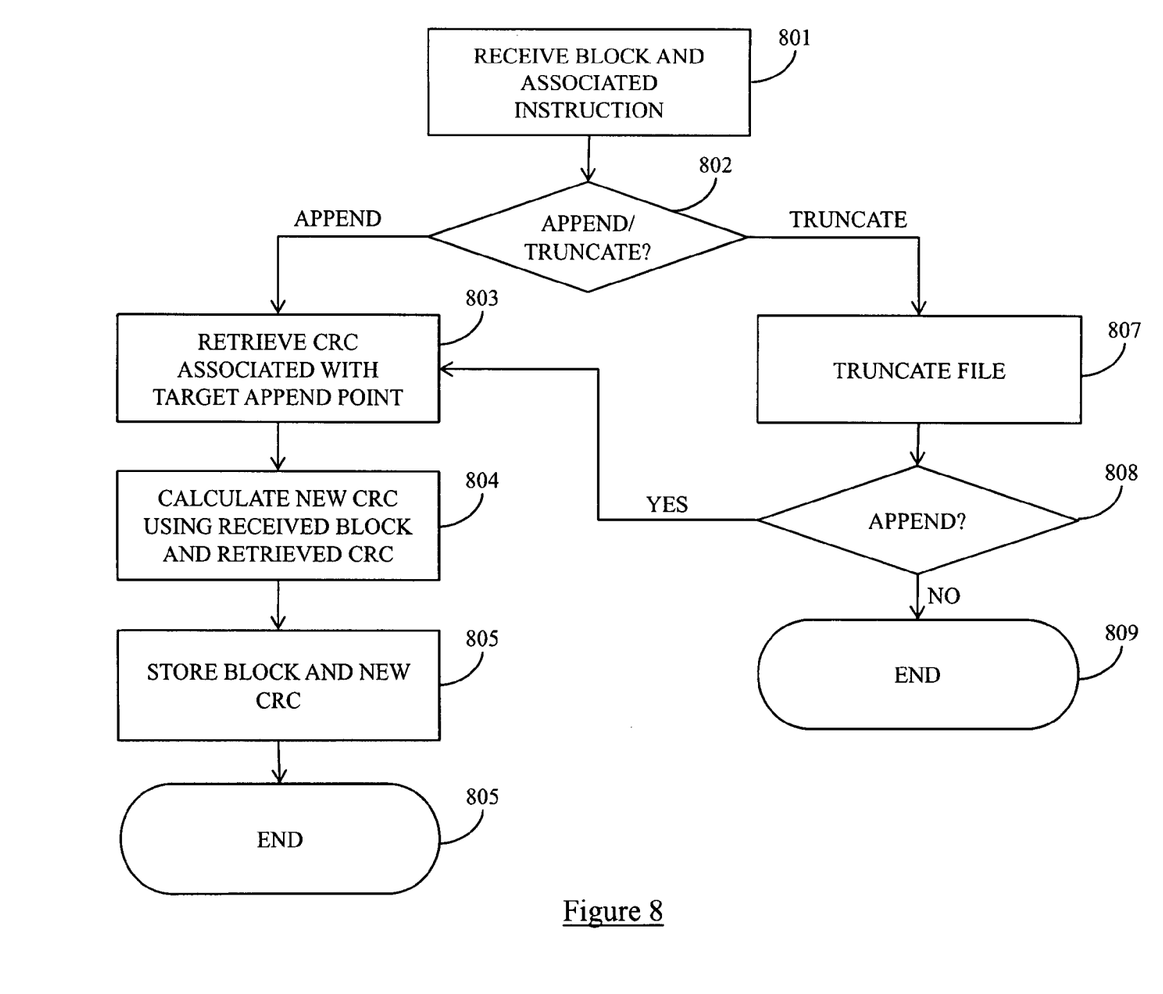
FIG. 8 is a flow chart showing a method for appending and truncating a file according to an embodiment of the present invention.

A method of storing and truncating sequential data according to an embodiment of the present invention is illustrated in FIG. 8. According to FIG. 8, the processor 704 receives a block of data and an associated instruction via interface 703 [step 801]. The processor determines if the instruction is associated with an append operation or a truncation operation [step 802]. In the case of an append operation, the instruction comprises data specifying the point in file 710 at which the accompanying data is to be appended (for example, append point A in FIG. 7). The apparatus then retrieves the CRC associated with the append position (CRC C7852) from storage 709 via storage adapter 708, and stores it in register 706a [step 803]. CRC logic 705 calculates a new CRC for the appended file using the retrieved CRC and data contained in the received block [step 804]. The calculated CRC provides a valid integrity measure for all blocks in file 710 up to and including the appended block of data. The received block and calculated CRC are then stored at the location specified by the associated instruction (append point A in file 710) [step 804] and the process is ended [step 805]. Alternatively, if the instruction relates to a truncate operation [step 802] the processor 704 then truncates file 710 by flagging, or otherwise rendering, by a known method, the relevant areas of storage 709 as available for overwriting. In some embodiments truncation may additionally (or alternatively) comprise overwriting the truncated block using random or pseudo random data such that the truncated blocks are rendered unreadable. Following truncation, processor 704 determines if the truncate instruction is also associated with a subsequent append operation [step 808]. If there is an associated append operation the processor proceeds to append data as described above [step 808], otherwise the process ends [step 809].

In other embodiments, truncation and appending may be embodied as a single operation, whereby appending occurs from a point (for example T), thereby over-writing previously stored data blocks. A skilled person will understand that many different arrangements of components from those shown in FIG. 7 are possible for implementing embodiments of the present invention. For example, the entire architecture may be implemented as a dedicated ASIC, obviating the need for a central processor. Moreover, disk storage 709 may be replaced by random access memory, tape media or indeed any form of storage media suitable for storing digital data.

Embodiments of the invention herein described provide a method and apparatus for efficient truncation and appending of data to a sequential file, such that intermediate integrity checks are preserved and recalculation of the overall integrity measure is not required. According to embodiments of the invention, where the file is large (thousands, millions or billions of blocks) significant time savings are achieved with negligible overhead in terms of additional storage for, and calculation of the intermediate integrity measures. The improved efficiency provided by embodiments of the invention is advantageous in applications where an integrity check of a sequential file is required (for example, backup sessions in a tape library or virtual tape library, a log file, video and audio streaming).

The above embodiments are to be understood as illustrative examples of the invention. Further embodiments of the invention are envisaged. For example, the intermediate checksum does not necessarily need to be stored after each block, but may instead be stored less frequently (for example, after every 10 blocks). It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. Storage apparatus comprising
a data store;
a data input; and
a data processor arranged to:
receive from the data input a block of data to be stored at an append point after sequential data comprising one or more stored blocks of data;
retrieve an integrity measure, of one or more stored integrity measures that are associated with one or more respective points in the sequential data, said retrieved integrity measure being associated with a point at or preceding the append point;
calculate a new integrity measure using the received block of data and the retrieved integrity measure, wherein the retrieved integrity measure has previously been calculated independent of the calculation of the new integrity measure; and
store the received block of data and the new integrity measure in the data store, in addition to at least one stored integrity measure that is associated with a point in the data at or preceding the append point, wherein subsequent deletion of the stored block or the new integrity measure does not require recalculation of the one or more stored integrity measures that are associated with one or more respective points in the sequential data.

2. Apparatus according to claim 1, wherein the append point is located such that the received block of data is stored after a last block of data in the sequential data.

3. Apparatus according to claim 1, wherein the append point is located such that the received block of data is stored after a first or intermediate block of data in the sequential data.

4. Apparatus according to claim 3, wherein the data processor is arranged to store the received block of data including by overwriting one or more blocks of data that were previously stored after the first or intermediate block of data in the sequential data.

5. Apparatus according to claim 1, wherein each block of data has an associated integrity measure.

6. Apparatus according to claim 5, wherein the data processor is arranged to store integrity measures in the sequential data coincident with the respective stored blocks of data.

7. Apparatus according to claim 6, wherein the data processor is arranged to store integrity measures appended to the respective stored blocks of data.

8. Apparatus according to claim 5, wherein the data processor is arranged to store integrity measures apart from, but associated with, the associated stored blocks of data.

9. Apparatus according to claim 1, wherein the data processor is arranged to receive and store in sequence a plurality of blocks of data, including calculating and storing an integrity measure for each block of received data using data of the received block of data and an integrity measure associated with a point at or preceding an associated append point.

10. Apparatus according to claim 9, wherein the data processor is arranged to store the plurality of blocks of data arranged in a linear sequence.

11. Apparatus according to claim 9, wherein the data processor is arranged to store the plurality of blocks of data arranged in a binary tree and/or comprise a linked list.

12. Apparatus according to claim 1, wherein the data processor is arranged to calculate the new integrity measure over a data set comprising data of the received block of data and the retrieved integrity measure.

13. Apparatus according to claim 1, wherein the data processor is arranged to calculate the new integrity measure as a cyclic redundancy check.

14. Apparatus according to claim 1, wherein the data processor is arranged to calculate the new integrity measure over a data set comprising data of the received block of data and the retrieved integrity measure is used as a seed of the integrity measure calculation.

15. The Apparatus of claim 1, wherein the calculation of the new integrity measure is not used to control calculation of the retrieved integrity measure that is associated with a point at or preceding the append point.

16. The Apparatus of claim 1, wherein the calculation of the new integrity measure does not require recalculation of the retrieved integrity measure that is associated with a point at or preceding the append point.

17. A method of updating sequential data comprising one or more blocks of data and one or more integrity measures stored on a storage medium, wherein each of the one or more integrity measures is associated with a point in the data, the method comprising:
receiving a block of data to be stored at an append point in the data;
retrieving from the storage medium an integrity measure associated with a point at or preceding the append point;
calculating a new integrity measure using the received block of data and the retrieved integrity measure, wherein the retrieved integrity measure has previously been calculated independent of the calculation of the new integrity measure; and,
storing the received block of data and the new integrity measure to the storage medium in addition to at least one stored integrity measure that is associated with a point at or preceding the append point, wherein subsequent deletion of the stored block or the new integrity measure does not require recalculation of the one or more stored sequential data.

18. The method of claim 17, wherein the calculation of the new integrity measure is not used to control calculation of the retrieved integrity measure that is associated with a point at or preceding the append point.

19. The method of claim 17, wherein the calculation of the new integrity measure does not require recalculation of the retrieved integrity measure that is associated with a point at or preceding the append point.

20. A non-transitory computer readable storage medium comprising computer readable instructions that upon execution cause a computer to:
- receive from a data input a block of data to be stored at an append point after sequential data comprising one or more stored blocks of data;
- retrieve an integrity measure, of one or more stored integrity measures that are associated with one or more respective points in the sequential data, said retrieved integrity measure being associated with a point at or preceding the append point;
- calculate a new integrity measure using the received block of data and the retrieved integrity measure, wherein the retrieved integrity measure has previously been calculated independent of the calculation of the new integrity measure; and
- store the received block of data and the new integrity measure in a data store, in addition to at least one stored integrity measure that is associated with a point in the data at or preceding the append point, wherein subsequent deletion of the stored block or the new integrity measure does not, require recalculation of the one or more stored integrity measures that are associated with one or more respective points in the sequential data.

* * * * *

UNITED STATES PATENT AND TRADEMARK OFFICE
CERTIFICATE OF CORRECTION

PATENT NO. : 8,316,289 B2  
APPLICATION NO. : 12/361669  
DATED : November 20, 2012  
INVENTOR(S) : Matthew Jack Burbridge et al.

Page 1 of 1

It is certified that error appears in the above-identified patent and that said Letters Patent is hereby corrected as shown below:

In column 8, line 39, in Claim 15, delete "Apparatus" and insert -- apparatus --, therefor.

In column 8, line 43, in Claim 16, delete "Apparatus" and insert -- apparatus --, therefor.

In column 8, line 66, in Claim 17, after "stored" insert -- integrity measures that are associated with one or more respective points in the --.

In column 10, line 13, in Claim 20, delete "not," and insert -- not --, therefor.

Signed and Sealed this  
Twelfth Day of March, 2013

Teresa Stanek Rea  
*Acting Director of the United States Patent and Trademark Office*